(12) United States Patent
Vats et al.

(10) Patent No.: US 10,950,430 B2
(45) Date of Patent: Mar. 16, 2021

(54) PULSED PLASMA DEPOSITION ETCH STEP COVERAGE IMPROVEMENT

(71) Applicant: Applied Materials, Inc., Santa Clara, CA (US)

(72) Inventors: Vinayak Veer Vats, San Ramon, CA (US); Hang Yu, Woodland, CA (US); Deenesh Padhi, Sunnyvale, CA (US); Changling Li, San Jose, CA (US); Gregory M. Amico, Gilroy, CA (US); Sanjay G. Kamath, Fremont, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 16/444,865

(22) Filed: Jun. 18, 2019

(65) Prior Publication Data
US 2019/0385844 A1    Dec. 19, 2019

Related U.S. Application Data

(60) Provisional application No. 62/687,100, filed on Jun. 19, 2018.

(51) Int. Cl.
*H01L 21/02* (2006.01)
*H01L 21/311* (2006.01)
(Continued)

(52) U.S. Cl.
CPC .... *H01L 21/02274* (2013.01); *H01L 21/0217* (2013.01); *H01L 21/0234* (2013.01);
(Continued)

(58) Field of Classification Search
None
See application file for complete search history.

(56) References Cited

U.S. PATENT DOCUMENTS

| 7,780,865 | B2 | 8/2010 | Balseanu et al. |
| 8,138,104 | B2 * | 3/2012 | Balseanu .............. C23C 16/345 |
| | | | 438/791 |

(Continued)

OTHER PUBLICATIONS

PCT Notification of Transmittal of the International Search Report and the Written Opinion of the International Searching Authority for International Application No. PCT/US2019/033832; dated Sep. 11, 2019; 14 total pages.

*Primary Examiner* — Stephanie P Duclair
(74) *Attorney, Agent, or Firm* — Patterson + Sheridan, LLP

(57) ABSTRACT

Embodiments of the present disclosure relate to methods for in-situ deposition and treatment of a thin film for improved step coverage. In one embodiment, the method for processing a substrate is provided. The method includes forming a dielectric layer on patterned features of the substrate by exposing the substrate to a gas mixture of a first precursor and a second precursor simultaneously with plasma present in a process chamber, wherein the plasma is formed by a first pulsed RF power, exposing the dielectric layer to a first plasma treatment using a gas mixture of nitrogen and helium in the process chamber, and performing a plasma etch process by exposing the dielectric layer to a plasma formed from a gas mixture of a fluorine-containing precursor and a carrier gas, wherein the plasma is formed in the process chamber by a second pulsed RF power.

22 Claims, 3 Drawing Sheets

(51) Int. Cl.
  *H01L 21/306* (2006.01)
  *H01L 21/3065* (2006.01)
(52) U.S. Cl.
  CPC ...... *H01L 21/02211* (2013.01); *H01L 21/306* (2013.01); *H01L 21/3065* (2013.01); *H01L 21/311* (2013.01); *H01L 21/31116* (2013.01)

(56) References Cited

U.S. PATENT DOCUMENTS

| | | | |
|---|---|---|---|
| 8,563,095 B2 * | 10/2013 | Rajagopalan | C23C 16/45523 427/579 |
| 9,721,892 B2 | 8/2017 | Zhou | |
| 2005/0100682 A1 | 5/2005 | Fukiage et al. | |
| 2008/0057724 A1 | 3/2008 | Kiehlbauch et al. | |
| 2010/0099266 A1 * | 4/2010 | Oswald | H01J 37/32009 438/719 |
| 2010/0099271 A1 | 4/2010 | Hausmann et al. | |
| 2018/0323038 A1 | 11/2018 | Valcore, Jr. et al. | |

* cited by examiner

PULSED PLASMA DEPOSITION ETCH STEP COVERAGE IMPROVEMENT

CROSS-REFERENCE TO RELATED APPLICATIONS

This application claims priority to U.S. Provisional Patent Application Ser. No. 62/687,100, filed on Jun. 19, 2018, which herein is incorporated by reference.

FIELD

Embodiments of the present disclosure generally relate to methods for semiconductor processing. Specifically, embodiments of the present disclosure relate to methods for in-situ deposition and treatment of a thin film for improved step coverage.

BACKGROUND

Dielectric layers have been used for applications such as barrier layers or spacers in the fabrication of modern semiconductor devices. The dielectric layers can be deposited over features, e.g., trenches or vias used for vertical interconnects, using a deposition process, such as chemical vapor deposition (CVD) or plasma enhanced chemical vapor deposition (PECVD). However, it has been challenging to deposit the dielectric layers over high aspect ratio features with adequate step coverage by the PECVD technique. The PECVD technique tends to deposit the dielectric layer more rapidly around the top than the bottom of the trenches due to the inability of the plasma to penetrate into the deep trenches. This results in pinching-off the narrow trenches from the top, forming a void in the trenches.

Therefore, there is a need in the art to provide an improved method for depositing dielectric layers in high aspect ratio trenches without forming voids or seams.

SUMMARY

Embodiments of the present disclosure relate to methods for in-situ deposition and treatment of a thin film for improved step coverage. In one embodiment, the method for processing a substrate is provided. The method includes forming a dielectric layer on patterned features of the substrate by exposing the substrate to a gas mixture of a first precursor and a second precursor simultaneously with plasma present in a process chamber, wherein the plasma is formed by a first pulsed RF power. The method further includes exposing the dielectric layer to a plasma treatment using a gas mixture of nitrogen and helium in the process chamber, and performing a plasma etch process by exposing the dielectric layer to a plasma formed from a gas mixture of a fluorine-containing precursor and a carrier gas, wherein the plasma is formed in the process chamber by a second pulsed RF power.

In another embodiment, a method for processing a substrate includes forming a dielectric layer on patterned features of the substrate by a plasma deposition process, wherein a first plasma is formed by a first pulsed RF power in a process chamber. The method further includes densifying the dielectric layer by a plasma treatment, and etching a portion of the dielectric layer by a plasma etch process, wherein a second plasma formed from a gas mixture of a fluorine-containing gas and a carrier gas, wherein the second plasma is formed in the process chamber by a second pulsed RF power.

In another embodiment, a method for processing a substrate includes forming a dielectric layer on patterned features of the substrate by a plasma deposition process, wherein a first plasma is formed by a first pulsed RF power in a process chamber. The method further includes densifying the dielectric layer by a plasma treatment using a gas mixture of nitrogen and helium in the process chamber, forming a first passivation layer on the dielectric layer, etching the first passivation layer and a portion of the dielectric layer by a plasma etch process to form a etched dielectric layer, wherein a second plasma is formed in the process chamber by a second pulsed RF power. The method further includes forming a second passivation layer on the etched dielectric layer.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. It is to be noted, however, that the appended drawings illustrate only typical embodiments of this disclosure and are therefore not to be considered limiting of its scope, for the disclosure may admit to other equally effective embodiments.

Figure 1:
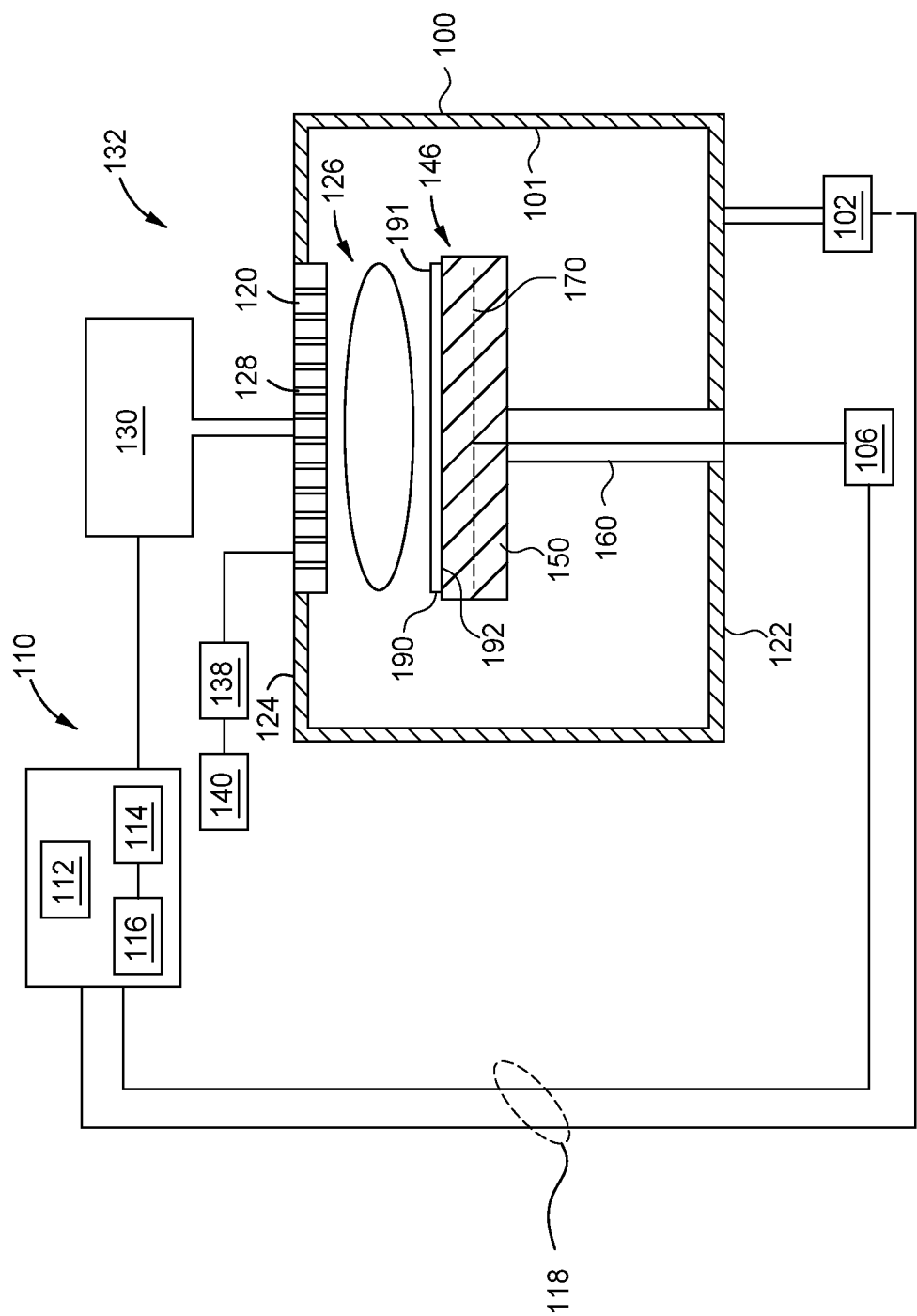
FIG. 1 depicts a schematic cross-sectional view of a deposition system that can be used for the practice of embodiments described herein.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments described herein will be described below in reference to a PECVD process that can be carried out using any suitable thin film deposition system. Examples of suitable systems include the CENTURA® systems which may use a DXZ® processing chamber, PRECISION 5000® systems, PRODUCER® systems, PRODUCER® GT™ systems, PRODUCER® XP Precision™ systems, PRODUCER® SE™ systems, Sym3® processing chamber, and Mesa™ processing chamber, all of which are commercially available from Applied Materials, Inc., of Santa Clara, Calif. Other tools capable of performing PECVD processes may also be adapted to benefit from the embodiments described herein. In addition, any system enabling the PECVD processes described herein can be used to advantage. The apparatus description described herein is illustrative and should not be construed or interpreted as limiting the scope of the embodiments described herein.

FIG. 1 depicts a schematic illustration of a substrate processing system 132 that can be used to perform deposition of a dielectric layer in accordance with embodiments described herein. The substrate processing system 132 includes a process chamber 100 coupled to a gas panel 130 and a controller 110. The process chamber 100 generally includes a top wall 124, a sidewall 101 and a bottom wall 122 that define a processing volume 126. A substrate support assembly 146 is provided in the processing volume 126 of the process chamber 100. The substrate support assembly 146 generally includes a substrate support, such as an electrostatic chuck 150, supported by a stem 160. The electrostatic chuck 150 may be moved in a vertical direction inside the process chamber 100 using any suitable mechanism. An electrode 170 is embedded in the electrostatic chuck 150, and a power source 106 is coupled to the electrode 170. A substrate 190 is disposed on a surface 192 of the electrostatic chuck 150.

A vacuum pump 102 is coupled to a port formed in the bottom of the process chamber 100. The vacuum pump 102 is used to maintain a desired gas pressure in the process chamber 100. The vacuum pump 102 also evacuates post-processing gases and by-products of the process from the process chamber 100. The substrate processing system 132 may further include additional equipment for controlling the chamber pressure, for example, valves (e.g., throttle valves and isolation valves) positioned between the process chamber 100 and the vacuum pump 102 to control the chamber pressure.

A gas distribution assembly 120 having a plurality of apertures 128 is disposed on the top of the process chamber 100 above the electrostatic chuck 150. The apertures 128 of the gas distribution assembly 120 are utilized to introduce process gases into the process chamber 100. The apertures 128 may have different sizes, number, distributions, shape, design, and diameters to facilitate the flow of the various process gases for different process requirements. The gas distribution assembly 120 is connected to the gas panel 130 that allows various gases to supply to the processing volume 126 during processing. A plasma is formed from the process gas mixture exiting the gas distribution assembly 120 to enhance thermal decomposition of the process gases resulting in the deposition of material on a surface 191 of the substrate 190.

The gas distribution assembly 120 and the electrostatic chuck 150 may form a pair of spaced apart electrodes in the processing volume 126. One or more RF power source 140 provide a bias potential through a matching network 138, which is optional, to the gas distribution assembly 120 to facilitate generation of plasma between the gas distribution assembly 120 and the electrostatic chuck 150. Alternatively, the RF power source 140 and the matching network 138 may be coupled to the gas distribution assembly 120, the electrostatic chuck 150, or coupled to both the gas distribution assembly 120 and the electrostatic chuck 150, or coupled to an antenna (not shown) disposed exterior to the process chamber 100. In some embodiments, the RF power source 140 may produce power at a frequency of 350 KHz, 2 MHz, 13.56 MHz, 27 MHz, 40 MHz, 60 MHz, or 100 MHz. In one embodiment, the RF power source 140 may provide between about 100 Watts and about 3,000 Watts at a frequency of about 50 kHz to about 13.6 MHz. In another embodiment, the RF power source 140 may provide between about 500 Watts and about 1,800 Watts at a frequency of about 50 kHz to about 13.6 MHz.

The controller 110 includes a central processing unit (CPU) 112, a memory 116, and a support circuit 114 utilized to control the process sequence and regulate the gas flows from the gas panel 130. The CPU 112 may be of any form of a general-purpose computer processor that may be used in an industrial setting. The software routines can be stored in the memory 116, such as random access memory, read only memory, floppy, or hard disk drive, or other form of digital storage. The support circuit 114 is conventionally coupled to the CPU 112 and may include cache, clock circuits, input/output systems, power supplies, and the like. Bi-directional communications between the controller 110 and the various components of the substrate processing system 132 are handled through numerous signal cables collectively referred to as signal buses 118, some of which are illustrated in FIG. 1.

Figure 2A:
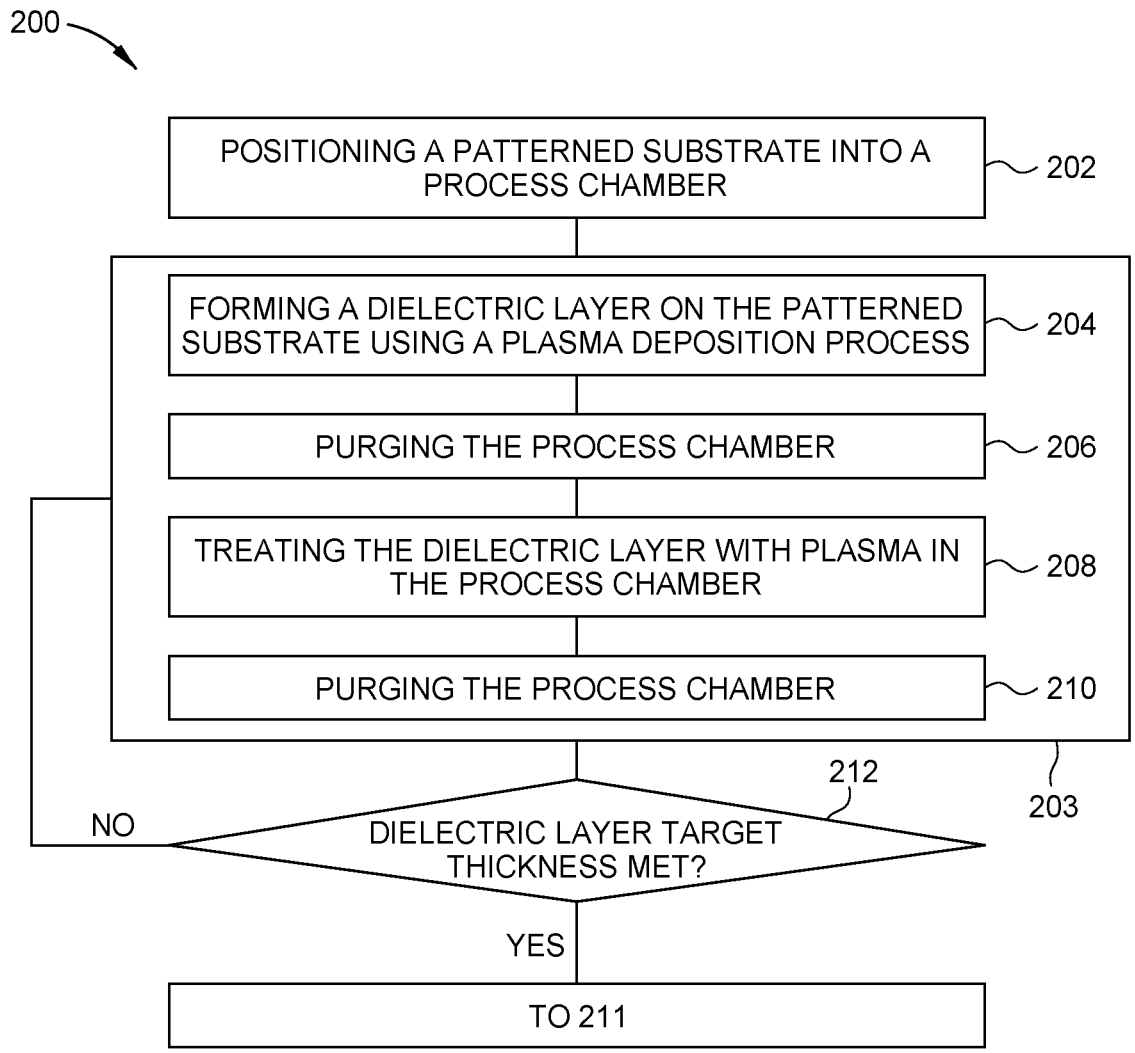
FIGS. 2A and 2B depict a flow diagram of a method for forming a dielectric layer over a substrate in accordance with embodiments of the present disclosure.
Figure 2B:
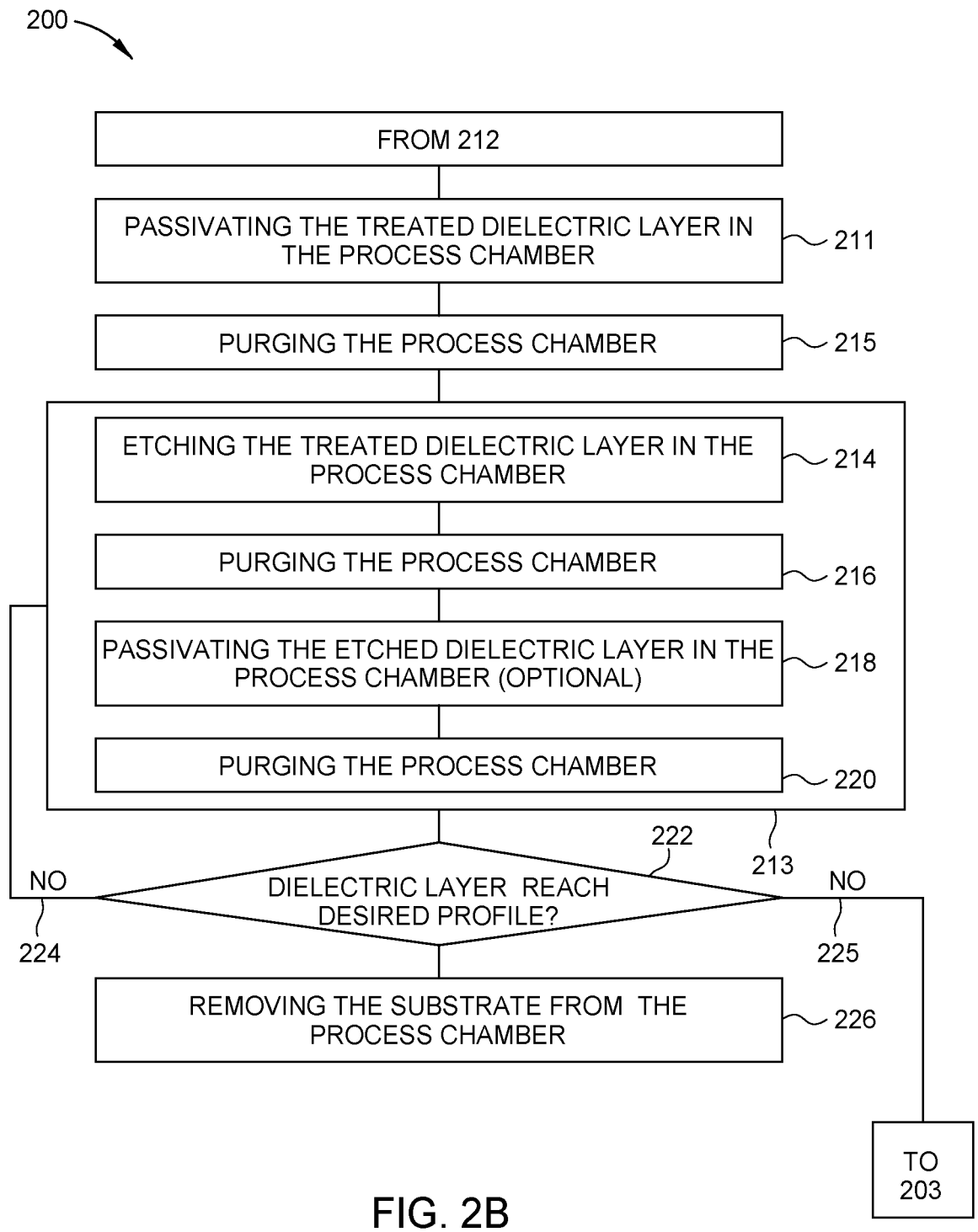

FIGS. 2A and 2B depict a flow diagram of a method 200 for forming a dielectric layer over a substrate in accordance with embodiments of the present disclosure. All of the operations of the method 200 may be performed in the same process chamber, such as a PECVD chamber. It should also be understood that the operations depicted in FIG. 2 may be performed simultaneously and/or in a different order than the order depicted in FIG. 2. In addition, while the dielectric layer is discussed herein using a PECVD technique, the concept of this disclosure can also be utilized towards other layers that are deposited by a thermal process or any plasma-assisted process.

The method 200 begins at operation 202 by placing a substrate into a process chamber, such as the process chamber 100 shown in FIG. 1. After the substrate is disposed in the process chamber 100, an in-situ deposition-treatment process 203 is performed in the process chamber 100. As will be discussed in more detail below, the in-situ deposition-treatment process 203 generally includes operation 204 (film deposition), operation 206 (chamber purging), operation 208 (plasma treatment), and operation 210 (chamber purging). The substrate may be a patterned substrate having at least one formed feature across a surface thereof. The formed feature may be any type of feature such as a trench, via, interconnect, or gate stack, for example. The substrate may be a portion of an intermediate structure of a semiconductor device, such as a FinFET device. The substrate may be a bulk semiconductor substrate, a semiconductor-on-insulator (SOI) substrate, or the like, which may be doped (e.g., with a p-type or an n-type dopant) or undoped. The substrate may include an elemental semiconductor including silicon (Si) or germanium (Ge); a compound semiconductor; an alloy semiconductor; or a combination thereof. In one embodiment, the substrate has a plurality of trenches formed in the surface of the substrate. The trenches may have an aspect ratio of about 2:1 to about 20:1, for example about 3:1 to about 10:1. The term "aspect ratio" in this disclosure refers to the ratio of the height dimension to the width dimension of a particular feature, for example, trench height/trench width.

At operation 204, a dielectric layer is formed on the substrate using a plasma deposition process. In one embodiment, the dielectric layer is a nitride, such as a silicon nitride. The dielectric layer is formed on exposed surfaces of the substrate, for example, the top surface, the sidewall surface, and the bottom surface of the trenches in the substrate. The deposition of the dielectric layer is performed by exposing the substrate to a gas mixture of a nitrogen-containing precursor and a silicon-containing precursor simultaneously with plasma present in the process chamber. The gas mixture may be flowed from the gas panel 130 into the processing volume 126 through the gas distribution assembly 120. In some cases, the nitrogen-containing precursor and the silicon-containing precursor may be introduced into the process chamber separately and can be in any sequence order. Depending on the application, the gas mixture may optionally include helium, nitrogen, oxygen, nitrous oxide, argon, or any suitable inert gas or carrier gas.

Suitable nitrogen-containing precursor may include ammonia ($NH_3$), nitrogen ($N_2$), nitrous oxide ($N_2O$), nitric oxide (NO), nitrogen dioxide ($NO_2$), and any combination thereof. In one embodiment, the nitrogen-containing precursor is ammonia. Suitable silicon-containing precursor may include organosilicon compounds having a ratio of oxygen to silicon atoms of 0 to about 6. Suitable organosilicon compounds may be siloxane compounds, halogenated siloxane compounds that include one or more halogen moieties (e.g., fluoride, chloride, bromide, or iodide), such as tetrachlorosilane, dichlorodiethoxysiloxane, chlorotriethoxysiloxane, hexachlorodisiloxane, and/or octachlorotrisiloxane, and aminosilanes, such as trisilylamine (TSA), hexamethyldisilazane (HMDS), silatrane, tetrakis(dimethylamino)silane, bis(diethylamino)silane, tris(dimethyl-amino)chlorosilane, and methylsilatrane. Other silicon-containing precursors, such as silanes, halogenated silanes, organosilanes, and any combinations thereof, may also be used. Silanes may include silane ($SiH_4$) and higher silanes with the empirical formula $Si_xH_{(2x+2)}$, such as disilane ($Si_2H_6$), trisilane ($Si_3H_8$), and tetrasilane ($Si_4H_{10}$), or other higher order silanes such as polychlorosilane. Other silicon-containing precursor, such as octamethylcyclotetrasiloxane (OMCTS), methyldiethoxysilane (MDEOS), bis(tertiary-butylamino)silane (BTBAS), tridimethylaminosilane (TriDMAS), trisdimethylaminosilane (TrisDMAS), dichlorosilane, trichlorosilane, dibromosilane, silicon tetrachloride, silicon tetrabromide, or combinations thereof, may also be used. In one embodiment, the silicon-containing precursor is silane. In another embodiment, the silicon-containing precursor is TSA.

During operation 204, the silicon-containing precursor may be introduced into the process chamber at a flow rate of between about 5 sccm and about 1000 sccm. The nitrogen-containing precursor may be introduced into the process chamber at a flow rate of between about 5 sccm and about 1000 sccm. An optional carrier gas, e.g., helium, may be introduced into the process chamber at a flow rate of between about 100 sccm and about 20000 sccm. The chamber pressure may be maintained at about 5 mTorr or greater, such as about 1 Torr to about 40 Torr, for example about 5 Torr to about 16 Torr, and the temperature of a substrate support in the process chamber may be between about 125° C. and about 580° C., for example about 150° C. to about 400° C., while the silicon-containing precursor and the nitrogen-containing precursor are flowed into the process chamber to deposit the dielectric layer. The plasma deposition process may be performed for about 2 seconds to about 120 seconds, for example about 6 seconds to about 30 seconds, which may vary depending upon the application.

The plasma may be provided at about 50 Watts to about 250 Watts of RF power at a frequency of 13.56 MHz and/or 350 KHz. The RF power may be provided to one or more electrodes of the process chamber 100. For example, the RF power may be provided to a showerhead, e.g., the gas distribution assembly 120, and/or a substrate support, e.g., the electrostatic chuck 150 of the process chamber 100. In some embodiments, the RF power is pulsed during the plasma deposition process to reduce the deposition rate of the dielectric layer on exposed surfaces of the trenches, thereby improving the sidewall step coverage of the dielectric layer in the trenches. The RF power can be pulsed with a duty cycle in a range from about 5% to about 30% and at a frequency in a range from about 10 kHz to about 20 kHz. The spacing between the showerhead and the substrate support may be greater than about 230 mils, such as between about 350 mils and about 800 mils.

At operation 206, the flow of the gas mixture into the process chamber 100 and the RF power are stopped, and any remaining gas mixture (e.g., silicon-containing precursor, nitrogen-containing precursor, and/or additional gas) is purged from the process chamber 100 by introducing a purge gas, such as nitrogen gas, into the process chamber 100. The purge gas is introduced into the process chamber at a time period and partial pressure that are selected to purge the residual gas mixture and/or the residual by-products. For example, the purge gas may be introduced into the process chamber at a flow rate of between about 100 and about 20000 sccm. The nitrogen gas may be flowed into the chamber for a period of time such as between about 0.1 seconds and about 60 seconds. The chamber pressure may be between about 5 mTorr and about 10 Torr, and the temperature of the substrate support in the process chamber 100 may be between about 125° C. and about 580° C. while the purge gas is flowed into the process chamber.

At operation 208, after the process chamber is purged, a plasma treatment is performed in the process chamber 100 to treat the deposited dielectric layer. The plasma treatment can densify the deposited dielectric layer and improve the mechanical properties of the deposited dielectric. For example, a modulus (Young's modulus) or hardness of the deposited dielectric layer can be increased after the plasma treatment. The improved mechanical properties allow the treated dielectric layer to sustain the harsh environment during the subsequent etch process with the required profile and/or conformity.

The plasma treatment may be performed by introducing a treatment gas mixture of nitrogen and helium into the process chamber 100 at a flow rate of between about 100 and about 20000 sccm. The ratio of the nitrogen and helium may be in a range of about 1 (nitrogen):3 (helium) to about 1 (nitrogen):10 (helium), for example about 1 (nitrogen):6 (helium). The nitrogen gas may be introduced into the process chamber at a flow rate of between about 100 and about 2000 sccm. The treatment gas mixture may be flowed into the process chamber for a period of time such as between about 0.1 seconds and about 120 seconds. The plasma may be provided by applying a RF power of between about 300 Watts and about 1200 Watts to the process chamber at a frequency of 13.56 MHz and/or 350 KHz. The chamber pressure may be between about 4 Torr and about 12 Torr, and the temperature of the substrate support in the process chamber 100 may be between about 125° C. and about 580° C. while the treatment gas mixture is flowed into the process chamber.

At operation 210, the plasma treatment is terminated and the process chamber is purged to remove the residual gas mixture and/or the residual by-products. The plasma treatment may be terminated by interrupting the RF power and the flow of the treatment gas mixture into the process chamber. The purging at operation 210 can be similar or identical to operation 206.

At operation 212, a decision is made as to determine whether the deposited dielectric layer that has been plasma treated reaches a target thickness. The deposited/treated dielectric layer may have a target thickness of about 5 Å to about 2000 Å, for example about 150 Å, which may vary depending upon the application. If the target thickness of the deposited/treated dielectric layer has not been reached, another cycle of deposition/plasma treatment process (e.g., operations 204, 206, 208 and 210) may be performed before the thickness of the deposited/treated dielectric layer is again compared to the target thickness. The in-situ deposition-treatment process 203 is repeated until the deposited/treated dielectric layer reaches the target thickness.

Once the deposited/treated dielectric layer reaches the target thickness, an in-situ plasma etch/treatment process 213 is performed in the process chamber 100. As will be discussed in more detail below, the in-situ plasma etch/treatment process 213 generally includes operation 214 (plasma etch), operation 216 (chamber purging), operation 218 (treatment), and operation 220 (chamber purging).

Prior to the in-situ plasma etch/treatment process 213 and after operation 212, the deposited/treated dielectric layer may be optionally passivated. At operation 211, an optional treatment is performed in the process chamber 100 to form a passivation layer on the dielectric layer. After operation 212, either the treatment process to form the passivation layer on the dielectric layer (operation 211) or the plasma etch process (operation 214) is performed. The optional treatment may be performed by exposing the dielectric layer to a silicon-containing precursor in the process chamber to form a thin silicon layer on the dielectric layer. Depending on the application, the dielectric layer may be exposed to additional gas or gases, such as helium, nitrogen, oxygen, nitrous oxide, argon, or any suitable inert gas or carrier gas. Suitable silicon-containing precursor may be similar or identical to the silicon-containing precursor used during operation 204. In one embodiment, the silicon-containing precursor is silane. In another embodiment, the silicon-containing precursor is TSA.

During operation 211, the silicon-containing precursor may be introduced into the process chamber at a flow rate of between about 5 sccm and about 1000 sccm. In some embodiments, a nitrogen-containing gas is introduced into the process chamber with the silicon-containing precursor, and the nitrogen-containing gas may be introduced into the process chamber at a flow rate of between about 5 sccm and about 1000 sccm. An optional carrier gas, e.g., helium, may be introduced into the process chamber at a flow rate of between about 100 sccm and about 20000 sccm. The chamber pressure may be maintained at about 5 mTorr or greater, such as about 1 Torr to about 40 Torr, for example about 5 Torr to about 16 Torr, and the temperature of a substrate support in the process chamber may be between about 125° C. and about 580° C., for example about 150° C. to about 400° C., while the silicon-containing precursor is flowed into the process chamber to deposit the silicon layer. In one embodiment, the silicon layer includes silicon molecules adsorbed on the dielectric layer. The optional treatment may be performed for about 1 seconds to about 60 seconds, for example about 2 seconds to about 30 seconds, which may vary depending upon the application. The treatment helps the subsequent etch process to be a "soft" etch process. "Soft" etch is referring to when the etchant such a fluorine ions or fluorine containing radicals attack the passivation layer on top of the dielectric layer, and the passivation layer reduces the impact of the fluorine ions or fluorine containing radicals and surface etching is thereby carried out. The additional benefit of the passivation layer can also impact the etch profile and improve the aspect ratio of the dielectric layer in the trench.

At operation 215, the treatment process is terminated and the process chamber is purged to remove the residual silicon-containing precursor and other gases. The treatment process may be terminated by interrupting the flow of the silicon-containing precursor into the process chamber. The purging at operation 215 can be similar or identical to operation 206.

The in-situ plasma etch/treatment process 213 starts at operation 214, a plasma etch process is performed in the process chamber 100 by exposing the silicon layer to etchants simultaneously with plasma present in the process chamber. In one embodiment, operation 214 is performed after operation 212 without performing operations 211 and 215. The plasma etch process can etch the silicon layer and a portion of the deposited/treated dielectric layer at the top portion of the trenches to prevent the opening from pinching off. This is because the reaction of the etching gas at the top portion of the trenches is typically faster than that at the sidewall surfaces, with the bottom surface of the trenches being the slowest due to a high aspect ratio of the trenches. The plasma etch process will remove the deposited/treated dielectric layer at the top portion of the trenches at a faster rate than that at the sidewall surfaces and the bottom surface of the trenches. As a result, the opening of the trenches is avoided from pinching off and a conformal profile of the dielectric layer can be obtained after the plasma etch process.

The plasma etch process may be performed by introducing a fluorine-containing precursor and a carrier gas into the process chamber 100. The fluorine-containing precursor and the carrier gas may be pre-mixed and introduced into the process chamber 100 as a gas mixture. In some embodiments, the plasma etch process may be performed in a radical-based ambient, i.e., using radicals from the fluorine-containing precursor and the carrier gas. Exemplary fluorine-containing precursor may include, but is not limited to, $NF_3$, $F_2$, $C_2F_6$, $CF_4$, $C_3F_8$, or suitable halogenated compound such as $SF_6$, etc. Suitable carrier gas may include argon, helium, nitrogen, oxygen, nitrous oxide, or any suitable inert gas or carrier gas. In one embodiment, $NF_3$ and argon are used during the plasma etch process. In another embodiment, $NF_3$ and helium are used during the plasma etch process. The use of argon as a carrier gas has been observed to be able to provide more uniform etch profiles than helium in some cases. The ratio of the fluorine-containing precursor and the carrier gas may be in a range of about 1 (fluorine-containing gas):6 (carrier gas) to about 1 (fluorine-containing precursor):20 (carrier gas), for example about 1 (fluorine-containing precursor):10 (carrier gas). In one example, the fluorine-containing precursor is introduced into the process chamber 100 at a flow rate of between about 0 and about 500 sccm, such as example about 50 sccm to about 200 sccm, for example about 100 sccm. The argon gas is introduced into the process chamber 100 at a flow rate of about 1 SLM to about 4 SLM. The plasma etch process may be performed for a period of time such as between about 0.1 seconds and about 120 seconds, which may vary depending upon the application. The plasma may be provided by applying a RF power of between about 100 Watts and about 500 Watts, for example about 300 Watts, to the process chamber at a frequency of 13.56 MHz and/or 350 KHz. The chamber pressure may be between about 1 Torr to about 40 Torr, for example about 2 Torr and about 10 Torr, and the temperature of the substrate support in the process chamber 100 may be between about 125° C. and about 580° C. while the fluorine-containing gas and argon gas are flowed into the process chamber.

The RF power may be provided to one or more electrodes of the process chamber 100. For example, the RF power may be provided to a showerhead, e.g., the gas distribution assembly 120, and/or a substrate support, e.g., the electrostatic chuck 150 of the process chamber 100. In some embodiments, the RF power is pulsed during the plasma etch process to reduce the etch rate of the dielectric layer on exposed surfaces of the trenches, thereby providing more controllable etching process. The RF power can be pulsed with a duty cycle in a range from about 5% to about 30%, for example about 10% duty cycle, and at a frequency in a range from about 5 kHz to about 30 kHz, for example about 10 kHz. The RF power can have a pulsing width of about 1

μs to about 50 μs. The RF power may be adjusted based on the etch time to obtain different etching profiles of the deposited dielectric layer. Table 1 below illustrates examples of etching profiles of a deposited dielectric layer in a trench after different plasma etch processes. The following etch and plasma parameters are used to etch the deposited dielectric layer. The substrate temperature is about 280° C. The chamber pressure is about 2 Torr. The flow rate of the fluorine-containing gas (e.g., NF3) is about 100 sccm. The flow rate of the carrier gas (e.g., Ar) is about 1000 sccm. The pulse width of the RF power is about 10 μs. The RF power can be pulsed with a duty cycle of about 10%, and at a frequency of about 10 kHz.

TABLE 1

| | | | |
|---|---|---|---|
| Etch time (s) | 20 | 40 | 40 |
| Power (W) | 100 | 100 | 300 |
| A: Top sidewall thickness (nm) | 6.5 ± 0.3 | 4.3 ± 0.3 | 0 |
| B: Bottom sidewall thickness (nm) | 3.6 ± 0.2 | 2.8 ± 0.3 | 0 |
| C: Top surface thickness (nm) | 13.1 ± 0.2 | 3.7 ± 0.3 | ~0 |
| Step coverage (B/A) | 55% | 64% | Completely etched |
| Step coverage (B/C) | 27% | 75% | Completely etched |

As can be seen, higher RF power can increase the etch rate, and the longer etch time can result in the dielectric layer deposited on top surface of the trench being etched at a faster rate than that on the top sidewall, with the bottom sidewall being the lowest. Different etch time and the RF power can be used to adjust the step coverage of the deposited dielectric layer in the trenches. Longer etch time with higher RF power (e.g., 300 Watts), however, can complete etch the dielectric layer.

It has been observed that applying RF power pulsing in certain carrier gas may result in different etching incubation time (i.e., the amount of time before etching effect occurs). For example, applying RF power pulsing in argon gas has shown an etching incubation time of about 2.1 seconds. Without RF pulsing, the fluorine-containing precursor in argon or other carrier gas such as helium may result in etching effect occurred immediately at the deposited/treated dielectric layer. Therefore, the pulsing of the RF power may be adjusted based on the carrier gas used to control the etching profile. For example, in cases where argon is used as the carrier gas, the pulse width of the RF power may be about 5 μs to about 12 μs, for example about 10 μs. In cases where helium is used as the carrier gas, the pulse width of the RF power may be about 15 μs to about 25 μs, for example about 20 μs. The chamber pressure may be adjusted to enhance the etching effect. For example, when argon is used as the carrier gas, the chamber pressure may be about 2 Torr. When helium is used as the carrier gas, a higher chamber pressure, such as about 5 Torr, may be used.

At operation 216, the plasma etch process is terminated and the process chamber is purged to remove the residual etch gas mixture and/or the residual by-products. The plasma etch process may be terminated by interrupting the RF power and the flow of the etchants into the process chamber. The purging at operation 216 can be similar or identical to operation 206.

At operation 218, an optional treatment is performed in the process chamber 100. Operation 218 may be similar or identical to operation 211. The treatment process performed after the plasma etch process at operation 214 has the additional benefit of passivating defects or dangling bonds on the surface of the etched dielectric layer after plasma etching.

At operation 220, the optional treatment process is terminated and the process chamber is purged to remove the residual gas mixture and/or the residual by-products. The optional treatment process may be terminated by interrupting the flow of the silicon-containing precursor into the process chamber. The purging at operation 220 can be similar or identical to operation 206.

The in-situ plasma etch/treatment process 213 may be a cyclic process and repeated multiple times until a desired profile of the deposited dielectric layer is reached.

At operation 222, a decision is made as to determine whether the deposited dielectric layer that has been treated reaches a desired profile, e.g., as-deposited/treated dielectric layer is conformal and/or has sidewall step coverage in excess of about 95% or 99% without forming voids or seams in the trenches. If the desired profile has not been reached, another cycle of the in-situ plasma etch/treatment process 213 may be performed (e.g., route 224). In some embodiments, the in-situ deposition/treatment process 203 (e.g., operations 204, 206, 208 and 210), operations 211 and 215, and the in-situ etch/treatment process 213 (e.g., operations 214, 216, 218 and 220) may be performed (e.g., route 225) and repeated multiple times until a target thickness and profile are both reached. The in-situ deposition/treatment process 203 and the in-situ etch/treatment process 213 can repeat multiple times until the desired film thickness is obtained, for example about 2 to about 6 repetitions, for example 4 repetitions, may be performed.

At operation 226, once the deposited/treated dielectric layer reaches the target thickness and profile, the reactive gases or gas mixtures are turned-off and optionally purged from the process chamber 100. The process chamber 100 is then pumped down (using the vacuum pump 102, for example) and the substrate is transferred out of the process chamber 100 for further processing.

In summary, some of the benefits of the present disclosure provide methods for in-situ deposition, treatment, and etching of a dielectric layer (e.g., nitride) for improved step coverage. A pulse plasma is used to form a controllable plasma during the deposition and etching to allow for deposition and etching of the dielectric layer with enhanced sidewall step coverage without damaging the sidewall film or underlying layer. The in-situ process also minimizes cost of ownership, lowers fab space and faster throughput.

While the foregoing is directed to embodiments of the present disclosure, other and further embodiments of the disclosure may be devised without departing from the basic scope thereof.

The invention claimed is:

1. A method for processing a substrate, comprising:
   forming a dielectric layer on exposed surfaces of one or more trenches in the substrate by exposing the substrate to a gas mixture of a first precursor and a second precursor simultaneously with plasma present in a process chamber, wherein the plasma is formed by a first pulsed RF power;
   exposing the dielectric layer to a plasma densification treatment using a gas mixture of nitrogen and helium in the process chamber to form a treated dielectric layer;
   forming a passivation layer on the treated dielectric layer in the process chamber; and
   performing a plasma etch process by exposing the treated dielectric layer and the passivation layer to a plasma formed from a gas mixture of a fluorine-containing precursor and a carrier gas, wherein the plasma is formed in the process chamber by a second pulsed RF power with a frequency of about 5 kHz to about 30 kHz, the plasma etch process etching a top portion of the one or more trenches at a faster rate than at a bottom surface of the one or more trenches.

2. The method of claim 1, wherein the forming the passivation layer further comprises exposing the treated dielectric layer to a silicon-containing precursor.

3. The method of claim 2, wherein the silicon-containing precursor comprises silane.

4. The method of claim 2, wherein the treated dielectric layer is exposed to a nitrogen-containing gas while exposing to the silicon-containing precursor.

5. The method of claim 1, further comprising:
before and/or after the first plasma densification treatment, purging the process chamber.

6. The method of claim 1, wherein the trenches have an aspect ratio of about 3:1 to about 10:1.

7. The method of claim 1, wherein the plasma densification treatment is performed at an RF power of about 300 W to about 1200 W.

8. The method of claim 1, wherein the plasma etch process prevents a top opening of the one or more trenches from pinching off and a conformal profile of the dielectric layer is obtained.

9. A method for processing a substrate, comprising:
forming a dielectric layer on exposed surfaces of one or more trenches in the substrate by a plasma deposition process, wherein a first plasma is formed by a first pulsed RF power in a process chamber;
densifying the dielectric layer by a plasma treatment to form a treated dielectric layer;
forming a passivation layer on the treated dielectric layer and within the one or more trenches; and
etching a portion of the treated dielectric layer and the passivation layer by a plasma etch process, wherein a second plasma formed from a gas mixture of a fluorine-containing gas and a carrier gas, wherein the second plasma is formed in the process chamber by a second pulsed RF power, a top portion of the one or more trenches etched at a faster rate than at a bottom surface of the one or more trenches.

10. The method of claim 9, wherein the first and second pulsed RF power has a duty cycle in a range from about 5% to about 30% and a frequency in a range from about 10 kHz to about 20 kHz.

11. The method of claim 9, wherein the second pulsed RF power has a pulsing width of about 1 µm to about 50 µm.

12. The method of claim 9, wherein the dielectric layer is silicon nitride.

13. The method of claim 9, wherein the plasma etch process is performed in a radical-based ambient.

14. The method of claim 9, wherein the fluorine-containing gas of the plasma etch process comprises $NF_3$, $F_2$, $C_2F_6$, $CF_4$, $C_3F_8$, or $SF_6$.

15. The method of claim 14, wherein the carrier gas of the plasma etch process comprises argon, helium, nitrogen, oxygen, or nitrous oxide.

16. The method of claim 15, wherein a ratio of the fluorine-containing gas and the carrier gas is in a range of about 1 (fluorine-containing gas):6 (carrier gas) to about 1 (fluorine-containing gas):20 (carrier gas).

17. A method for processing a substrate, comprising:
forming a dielectric layer on patterned features of the substrate by a plasma deposition process, wherein a first plasma is formed by a first pulsed RF power in a process chamber;
densifying the dielectric layer by a plasma treatment using a gas mixture of nitrogen and helium in the process chamber to form a treated dielectric layer;
forming a first passivation layer on the treated dielectric layer;
etching the first passivation layer and a portion of the dielectric layer by a plasma etch process to form an etched dielectric layer, wherein a second plasma is formed in the process chamber by a second pulsed RF power at a frequency of about 5 kHz to about 30 kHz to etch a top surface of the patterned features at a faster etch rate than at a bottom sidewall of the patterned features; and
forming a second passivation layer on the etched dielectric layer.

18. The method of claim 17, wherein the plasma deposition process comprises flowing a first precursor and a second precursor into the process chamber.

19. The method of claim 18, wherein the first precursor is a nitrogen-containing precursor comprising ammonia or nitrogen, and the second precursor is a silicon-containing precursor comprising silane or trisilylamine (TSA).

20. The method of claim 17, wherein the plasma treatment uses a gas mixture of nitrogen and helium in the process chamber.

21. The method of claim 20, wherein a ratio of the nitrogen and helium in the plasma treatment is in a range of about 1 (nitrogen):3 (helium) to about 1 (nitrogen): 10 (helium).

22. The method of claim 17, wherein the first and second passivation layers comprise silicon layers.

* * * * *